(12) United States Patent
Drzymala (10) Patent No.: US 9,275,263 B2
(45) Date of Patent: Mar. 1, 2016

(54) IMAGING READER WITH PLUG-IN IMAGING MODULES FOR ELECTRO-OPTICALLY READING INDICIA

(75) Inventor: Mark Drzymala, Commack, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 299 days.

(21) Appl. No.: 12/315,027

(22) Filed: Nov. 26, 2008

(65) Prior Publication Data
US 2010/0127082 A1 May 27, 2010

(51) Int. Cl.
*G06K 7/10* (2006.01)
*H05K 1/14* (2006.01)
*H05K 1/18* (2006.01)

(52) U.S. Cl.
CPC .......... *G06K 7/10722* (2013.01); *G06K 7/1096* (2013.01); *G06K 7/1098* (2013.01); *H05K 1/141* (2013.01); *H05K 1/182* (2013.01); *H05K 2201/10121* (2013.01); *H05K 2201/10477* (2013.01)

(58) Field of Classification Search
USPC .................................................. 235/462.41
See application file for complete search history.

(56) References Cited

U.S. PATENT DOCUMENTS

| | | |
|---|---|---|
| 4,613,895 A | 9/1986 | Burkey et al. |
| 4,794,239 A | 12/1988 | Allais |
| 5,059,779 A | 10/1991 | Krichever et al. |
| 5,124,539 A | 6/1992 | Krichever et al. |
| 5,200,599 A | 4/1993 | Krichever et al. |
| 5,304,786 A | 4/1994 | Pavlidis et al. |
| 5,703,349 A | 12/1997 | Meyerson et al. |
| 6,000,619 A * | 12/1999 | Reddersen ......... G06K 7/10653 235/462.43 |
| 7,191,947 B2 | 3/2007 | Kahn et al. |
| 2004/0164165 A1* | 8/2004 | Havens .............. G06K 7/10574 235/462.43 |
| 2005/0279836 A1* | 12/2005 | Havens .............. G06K 7/10574 235/472.01 |
| 2006/0022051 A1* | 2/2006 | Patel .................. G06K 7/10693 235/462.14 |
| 2008/0179402 A1* | 7/2008 | Barkan .............. G06K 7/10722 235/462.41 |
| 2009/0001166 A1* | 1/2009 | Barkan .............. G06K 7/10801 235/462.14 |
| 2009/0020611 A1* | 1/2009 | Sackett ................ G06K 7/1096 235/462.08 |
| 2009/0166426 A1* | 7/2009 | Giebel .................... G02B 3/14 235/462.42 |

FOREIGN PATENT DOCUMENTS

WO 2009006419 1/2009

OTHER PUBLICATIONS

International Search Report and Written Opinion dated Apr. 2, 2010 in related case PCT/US2009/062938.
International Preliminary Report on Patentability and Written Opinion for counterpart International Patent Application No. PCT/US2009/062938 mailed on Jun. 9, 2011.

* cited by examiner

Primary Examiner — Michael G Lee
Assistant Examiner — David Tardif
(74) Attorney, Agent, or Firm — Nong-Qiang Fan (57) ABSTRACT

A plurality of imaging modules, each including a solid-state imager mounted on an individual printed circuit board (PCB), is mounted in a reader, such as a bi-optical, dual window, point-of-transaction workstation, for capturing images along different fields of view of diverse targets useful for customer identification, customer payment validation, operator surveillance, and coded indicia. The imaging modules are individually mounted on a motherboard for individual installation at, and individual removal from, the reader.

20 Claims, 5 Drawing Sheets

IMAGING READER WITH PLUG-IN IMAGING MODULES FOR ELECTRO-OPTICALLY READING INDICIA

BACKGROUND OF THE INVENTION

Flat bed laser readers, also known as horizontal slot scanners, have been used to electro-optically read one-dimensional bar code symbols, particularly of the Universal Product Code (UPC) type, at a point-of-transaction workstation in supermarkets, warehouse clubs, department stores, and other kinds of retailers for many years. As exemplified by U.S. Pat. No. 5,059,779; U.S. Pat. No. 5,124,539 and U.S. Pat. No. 5,200,599, a single, horizontal window is set flush with, and built into, a horizontal countertop of the workstation. Products to be purchased bear an identifying symbol and are typically slid across the horizontal window through which a multitude of scan lines is projected in a generally upwards direction. When at least one of the scan lines sweeps over a symbol associated with a product, the symbol is processed and read.

The multitude of scan lines is generated by a scan pattern generator which includes a laser for emitting a laser beam at a mirrored component mounted on a shaft for rotation by a motor about an axis. A plurality of stationary mirrors is arranged about the axis. As the mirrored component turns, the laser beam is successively reflected onto the stationary mirrors for reflection therefrom through the horizontal window as a scan pattern of the scan lines.

It is also known to provide a point-of-transaction workstation not only with a generally horizontal window, but also with a generally vertical or upright window that faces an operator at the workstation. The upright window is oriented generally perpendicularly to the horizontal window, or is slightly rearwardly or forwardly inclined. The laser scan pattern generator within this dual window or bi-optical workstation also projects the multitude of scan lines in a generally outward direction through the upright window toward the operator. The generator for the upright window can be the same as, or different from, the generator for the horizontal window. The operator slides the products past either window from right to left, or from left to right, in a "swipe" mode. Alternatively, the operator merely presents the symbol on the product to a central region of either window in a "presentation" mode. The choice depends on operator preference or on the layout of the workstation.

Sometimes, the upright window is not built into the workstation as a permanent installation. Instead, a vertical slot scanner is configured as a portable reader that is placed on the countertop of an existing horizontal slot scanner in a hands-free mode of operation. In the frequent event that large, heavy, or bulky products, that cannot easily be brought to the reader, have symbols that are required to be read, then the operator may also manually grasp the portable reader and lift it off, and remove it from, the countertop for reading the symbols in a handheld mode of operation.

Each product must be oriented by the operator with the symbol facing away from the operator and generally towards either window of the bi-optical workstation. Hence, the operator cannot see exactly where the symbol is during scanning. In typical "blind-aiming" usage, it is not uncommon for the operator to repeatedly swipe or present a single symbol several times before the symbol is successfully read, thereby slowing down transaction processing and reducing productivity.

The blind-aiming of the symbol is made more difficult because the position and orientation of the symbol are variable. The symbol may be located low or high, or right to left, on the product, or anywhere in between, or on any of six sides of a box-shaped product. The symbol may be oriented in a "picket fence" orientation in which the elongated parallel bars of the one-dimensional UPC symbol are vertical, or in a "ladder" orientation in which the symbol bars are horizontal, or at any orientation angle in between.

In such an environment, it is important that the laser scan lines located at, and projected from, either window provide a full coverage scan zone which extends down as close as possible to the countertop, and as high as possible above the countertop, and as wide as possible across the width of the countertop. The scan patterns projected into space in front of the windows grow rapidly in order to cover areas on products that are positioned not on the windows, but several inches therefrom. The scan zone must include scan lines oriented to read symbols positioned in any possible way across the entire volume of the scan zone.

As advantageous as these laser-based, point-of-transaction workstations have been in processing transactions involving products associated with one-dimensional symbols each having a row of bars and spaces spaced apart along one direction, the workstations cannot process stacked symbols, such as Code 49 which introduced the concept of vertically stacking a plurality of rows of bar and space patterns in a single symbol, as described in U.S. Pat. No. 4,794,239, or PDF417 which increased the amount of data that could be represented or stored on a given amount of surface area, as described in U.S. Pat. No. 5,304,786, or two-dimensional symbols.

Both one- and two-dimensional symbols, as well as stacked symbols, can also be read by employing solid-state imagers or sensors which have a one- or two-dimensional array of cells or photosensors that correspond to image elements or pixels in a field of view of the imager. Such an imager may include a one- or two-dimensional charge coupled device (CCD) or a complementary metal oxide semiconductor (CMOS) device, as well as associated circuits for producing electronic signals corresponding to the one- or two-dimensional array of pixel information over the field of view.

It is therefore known to use a solid-state imager for capturing a monochrome image of a symbol as, for example, disclosed in U.S. Pat. No. 5,703,349. It is also known to use a solid-state imager with multiple buried channels for capturing a full color image of a target as, for example, disclosed in U.S. Pat. No. 4,613,895. It is common to provide a two-dimensional CCD with a 640×480 resolution commonly found in VGA monitors, although other resolution sizes are possible.

It is also known to install the solid-state imager, analogous to that conventionally used in a consumer digital camera, in a bi-optical, point-of-transaction workstation, as disclosed in U.S. Pat. No. 7,191,947, in which the dual use of both the solid-state imager and the laser scan pattern generator in the same workstation is disclosed. It is possible to replace all of the laser scan pattern generators with solid-state imagers in order to improve reliability and to enable the reading of two-dimensional and stacked symbols, as well as other targets.

However, it was thought that an overall imager-based reader would require about ten to twelve imagers in order to read a symbol that could be positioned anywhere on all six sides of a product. To be successful in the marketplace, as disclosed in commonly-assigned U.S. patent application Ser. No. 11/823,818, filed Jun. 28, 2007, the entire contents of which are incorporated herein by reference thereto, an all imager-based reader must eliminate the need for so many imagers to bring the cost of all the imagers, as well as the cost of each imager, down to an acceptable level, and it must also match, or at least be comparable to, the working range, processing speed, productivity and performance of a laser-based reader. In the case of a bi-optical workstation having dual windows, the all imager-based reader must use similar window sizes and must also be able to scan anywhere across the windows and over a comparable working range as that of a laser-based reader, so that operators can achieve the high scanning productivity they have come to expect without any need to learn a new scanning technique.

As also disclosed in said application, each imager includes or is associated with an illuminator for illuminating the indicia with illumination light from one or more illumination light sources, e.g., light emitting diodes (LEDs). A programmed microprocessor or controller is operative for controlling each illuminator to illuminate the indicia, for controlling each imager to capture the illumination light returning from the indicia over an exposure time period to produce electrical signals indicative of the indicia being read, and for processing the electrical signals to read the indicia. The imagers, the illumination light sources and the controller are commonly assembled on a main printed circuit board (PCB) or motherboard to enable joint installation of the entire PCB assembly at, and joint removal of the entire PCB assembly from, the reader for ease of serviceability and to simplify field maintenance.

Yet, the joint installation and removal of the entire PCB assembly can be an expensive maintenance and manufacturing proposition. If only one imager malfunctions in the field, then the entire PCB assembly may have to be replaced. During manufacture, each imager typically includes a focusing lens that has to be optically adjusted to focus a target on the respective imager. It can be difficult to adjust multiple imagers, all on the same motherboard. If dust occurs on only one of the focusing lenses and/or on only one of the imagers, typically as a byproduct of such adjustment, then the entire PCB assembly may have to be removed to clean the dusty lens and/or imager, or replaced with a clean PCB assembly.

SUMMARY OF THE INVENTION

One feature of this invention resides, briefly stated, in a reader for, and a method of, electro-optically reading indicia, comprising a housing and a plurality of imaging modules, each module including a solid-state imager mounted on an individual printed circuit board (PCB), for capturing light from the indicia along different fields of view. Each imager preferably comprises a two-dimensional, charge coupled device (CCD) array. Each imager includes or is associated with an illuminator for illuminating the indicia with illumination light from one or more illumination light sources, e.g., light emitting diodes (LEDs). A controller is operative for controlling each illuminator to illuminate the indicia, for controlling each imager to capture the illumination light returning from the indicia over an exposure time period to produce electrical signals indicative of the indicia being read, and for processing the electrical signals to read the indicia. Each illuminator is only operative during the exposure time period. Each imager is controlled to capture the light from the indicia during different exposure time periods to avoid mutual interference among the illuminators.

In accordance with one aspect of this invention, the imaging modules are individually mounted on a motherboard or main PCB. This individual installation of each module at, and individual removal of each module from, the housing ensures, among other things, that the entire motherboard need not have to be replaced if only one of the imagers malfunctions or fails. Preferably, each module includes a plug-in module connector mounted on the individual PCB. Each module connector connects to a respective plug-in board connector mounted on the motherboard. A fastener on each module fastens the respective module to the motherboard. An indicator lamp can be placed on each module to visually indicate which module on the motherboard needs replacing, after removal of a protective cover from the housing.

In addition, as discussed above, it is easier to adjust the focusing lens of individual imagers, each on its own PCB, during manufacture, rather than adjust multiple imagers all mounted on the same motherboard. Also, as discussed above, it is easier to clean dust off of individual focusing lenses and/or individual imagers, each on its own PCB, then off of multiple focusing lenses and/or multiple imagers, all mounted on the same motherboard.

In a preferred embodiment, the housing has one window located in a generally horizontal plane, and another window located in a generally vertical or upright plane that intersects the generally horizontal plane, thereby comprising a bi-optical workstation. Six imaging modules are preferably used in the bi-optical workstation to capture images from six sides of a target. Six-sided reading is most commonly used in supermarkets. Department stores and mass merchandisers, however, often do not need a six-sided image capture capability. A less expensive imaging bi-optical reader can be created for department stores and mass merchandisers by eliminating one of more imagers. This is easily accomplished by removing one or more of the modules from the motherboard.

In addition, the modular nature of the modules enables individual modules to have different resolutions. For example, one or more modules at one or more locations on the motherboard may have imagers configured with a mega-pixel (MP) resolution, while others of the modules may have imagers configured with a VGA or wide VGA (WVGA) resolution. A reader can thus be configured with a high performance (all MP resolution), or a lower performance (all VGA resolution), or be configured with mixed different resolutions at different locations. Such upgrades or downgrades can be performed at manufacture or in the field.

In the bi-optical workstation, the modules capture the light from the indicia through at least one of the windows. A first sub-plurality, e.g., three, of the modules captures the light from the indicia through one of the windows, and a second sub-plurality, e.g., another three, of the modules captures the light from the indicia through another of the windows. Each sub-plurality of the modules captures the light from the indicia over different, intersecting fields of view. Preferably, the motherboard on which the modules are mounted is no more than 100 millimeters below the generally horizontal plane.

The return illumination light travels along an optical path within the housing between a respective window and a respective imager for a distance of at least thirty-five centimeters. Folding optics, such as mirrors, are operative for folding the optical path within the housing. Also, non-rotationally symmetrical optics, such as mirrors and lenses, are operative for optically modifying the field of view of at least one imager to correspond with at least one of the dimensions of the window. The optical elements within the housing, for folding at least one of the optical paths, are preferably commonly mounted on a support, particularly an enclosure that keeps dust, dirt, moisture, and like contaminants from reaching these optical elements. This support enables joint installation of the optical elements at, and joint removal of the optical elements from, the housing for ease of serviceability. The non-rotationally symmetrical optics for optically modifying the field of view of at least one of the imagers are preferably mounted on the respective imager and, in turn, on the individual PCB.

By way of numerical example, the generally horizontal window in a conventional laser-based bi-optical workstation measures about four inches in width by about six inches in length, and the generally vertical window measures about six inches in width by about ten inches in length. The field of view of an imager capturing illumination light from the imager through a respective window does not inherently have these dimensions at the respective window and, hence, the field of view must be modified so that it matches the dimensions of the respective window at the respective window, thereby enabling indicia to be reliably read when located anywhere at the respective window, as well as within a range of working distances therefrom.

Advantageously, each illuminator LED and the controller are commonly mounted on the motherboard. The LED is a heat source, which potentially could cause the performance of an adjacent imager to deteriorate as the temperature of the LED rises. As the imager gets hotter, more noise can be present in the captured image. By putting the respective imager on its own individual PCB, the imager is spaced away from its associated LED, thereby enhancing imager performance.

In accordance with another feature of this invention, the method of electro-optically reading indicia is performed by capturing light from the indicia along different fields of view of a plurality of solid-state imagers mounted on individual printed circuit boards (PCBs) to comprise a plurality of imaging modules, and by individually mounting the imaging modules on a motherboard or main PCB for individual installation at, and individual removal from, a reader for electro-optically reading the indicia. Preferably, the reader is configured with one window located in a generally horizontal plane, and another window located in a generally upright plane that intersects the generally horizontal plane.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
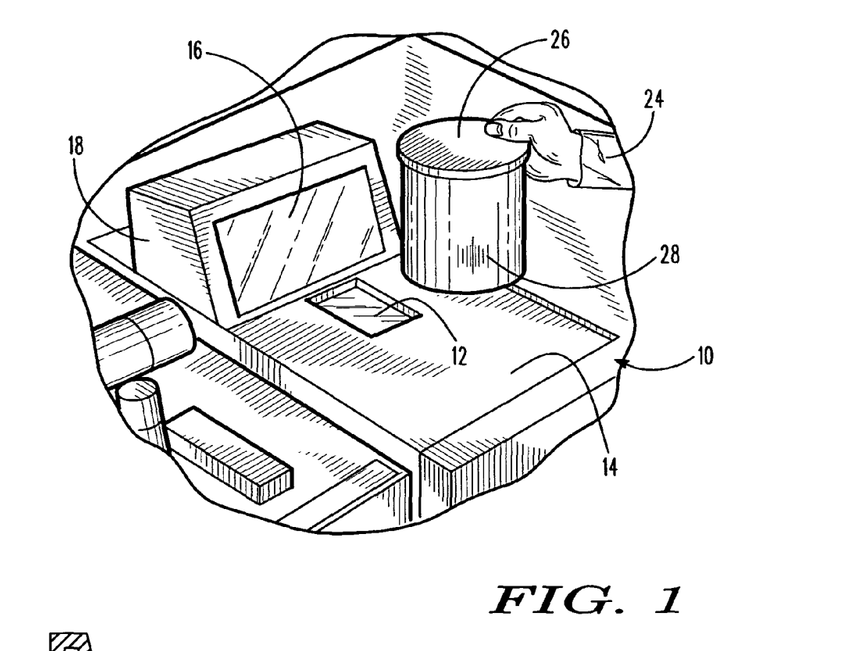
FIG. 1 is a perspective view of a dual window, bi-optical, point-of-transaction workstation or reader operative for reading indicia.

FIG. 1 depicts a dual window, bi-optical, point-of-transaction workstation 10 used by retailers to process transactions involving the purchase of products bearing an identifying target, such as the UPC symbol described above. Workstation 10 has a top wall 14 bounding a generally horizontal window 12 set flush with, or recessed into, a countertop, and a vertical or generally vertical (referred to as "vertical" or "upright" hereinafter) window 16 set flush with, or recessed into, a raised housing portion 18 above the countertop.

Figure 2:
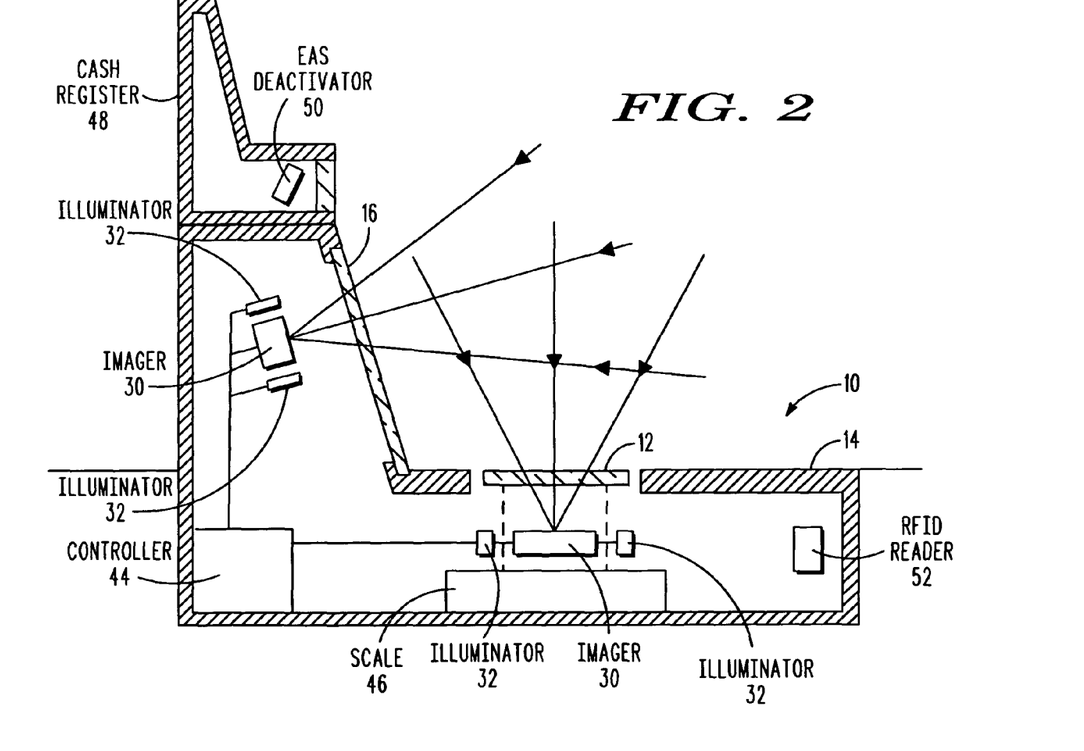
FIG. 2 is a part-sectional, part-diagrammatic, schematic view of a workstation analogous to that shown in FIG. 1.

As schematically shown in FIG. 2, a plurality of solid-state imagers 30, each including or associated with an illuminator 32, are also mounted at the workstation, for capturing light passing through either or both windows from a target which can be a one- or two-dimensional symbol, such as a two-dimensional symbol on a driver's license, or any document, as described below. Each imager 30 is a solid-state area array, preferably a CCD or CMOS array. Each illuminator 32 is preferably one or more light sources, e.g., surface-mounted, light emitting diodes (LEDs), located at each imager 30 to uniformly illuminate the target, as further described below.

In use, an operator 24, such as a person working at a supermarket checkout counter, processes a product 26 bearing a UPC symbol 28 thereon, past the windows 12, 16 by swiping the product across a respective window in the abovementioned swipe mode, or by presenting the product at the respective window in the abovementioned presentation mode. The symbol 28 may located on any of the top, bottom, right, left, front and rear, sides of the product, and at least one, if not more, of the imagers 30 will capture the illumination light reflected, scattered, or otherwise returning from the symbol through one or both windows. The imagers are preferably looking through the windows at around 45° so that they can each see a side of the product that is generally perpendicular to, as well as generally parallel to, a respective window.

FIG. 2 also schematically depicts that a weighing scale 46, a cash register 48, and an electronic article surveillance (EAS) deactivator 50 are mounted at the workstation. The generally horizontal window 12 advantageously serves not only as a weighing platter for supporting a product to be weighed, but also allows the return light to pass therethrough. The register 48 can sit atop the raised housing portion 18, or be integrated therewith. A radio frequency identification (RFID) reader 52 is also advantageously mounted at the workstation. The reader 52 can be mounted at any location and not only below the countertop, as shown.

As also schematically shown in FIG. 2, the imagers 30 and their associated illuminators 32 are operatively connected to a programmed microprocessor or controller 34 operative for controlling the operation of these and other components. Preferably, the microprocessor is the same as the one used for decoding the return light scattered from the target and for processing the captured target images.

In operation, the microprocessor 34 sends successive command signals to the illuminators 32 to pulse the LEDs for a short time period of 100 microseconds or less, and successively energizes the imagers 30 to collect light from a target only during said time period, also known as the exposure time period. By acquiring a target image during this brief time period, the image of the target is not excessively blurred even in the presence of relative motion between the imagers and the target.

There are several different types of targets that have particular utility for the enhancement of the operation of the workstation. The target may be a personnel check, a credit card, or a debit card presented by a customer for payment of the products being purchased. The operator need only swipe or present these payment targets at one of the windows for image capture.

The target may also be a signature, a driver's license, or the consumer himself or herself. Capturing an image of the driver's license is particularly useful since many licenses are encoded with two-dimensional indicia bearing age information, which is useful in validating a customer's age and the customer's ability to purchase age-related products, such as alcoholic beverages or tobacco products.

The target may be the operator himself or herself, which is used for video surveillance for security purposes. Thus, it can be determined if the operator is actually scanning the products, or passing them around the window in an effort to bypass the window and not charge the customer in a criminal practice known in retailing as "sweethearting".

The target may, of course, be a two-dimensional symbol whose use is becoming more widespread, especially in manufacturing environments and in package delivery. Sometimes, the target includes various lengths of truncated symbols of the type frequently found on frequent shopper cards, coupons, loyalty cards, in which case the area imagers can read these additional symbols.

The energization of the imagers 30 can be manual and initiated by the operator. For example, the operator can depress a button, or a foot pedal, at the workstation. The energization can also be automatic such that the imagers operate in a continuous image acquisition mode, which is the desired mode for video surveillance of the operator, as well as for decoding two-dimensional symbols. In the preferred embodiment, all the imagers will be continuously sequentially energized for scanning symbols until such time as there has been a period of inactivity that exceeds a pre-program time interval. For example, if no symbols have been scanned for ten minutes, then after this time period has elapsed, the reader enters a power-savings mode in which one or more of the imagers will be omitted from sequential energization. Alternatively, illumination levels may be reduced or turned off. At least one imager will remain active for periodically capturing images. If the active imager detects anything changing within its field of view, this will indicate to the operator that a product bearing a symbol is moving into the field of view, and illumination and image capture will resume to provide high performance scanning.

As previously stated, FIG. 2 is only a schematic representation of an all imager-based reader as embodied in a bi-optical workstation. Other housings having different shapes, with one or more windows, are also contemplated. A practical depiction of a bi-optical workstation is shown in FIGS. 3-4, in which all the imagers, now relabeled 1, 2, 3, 4, 5 and 6, and their illuminators 32, as well as other electrical components, as described below, are mounted on a main printed circuit board (PCB) or motherboard 54.

Figure 3:
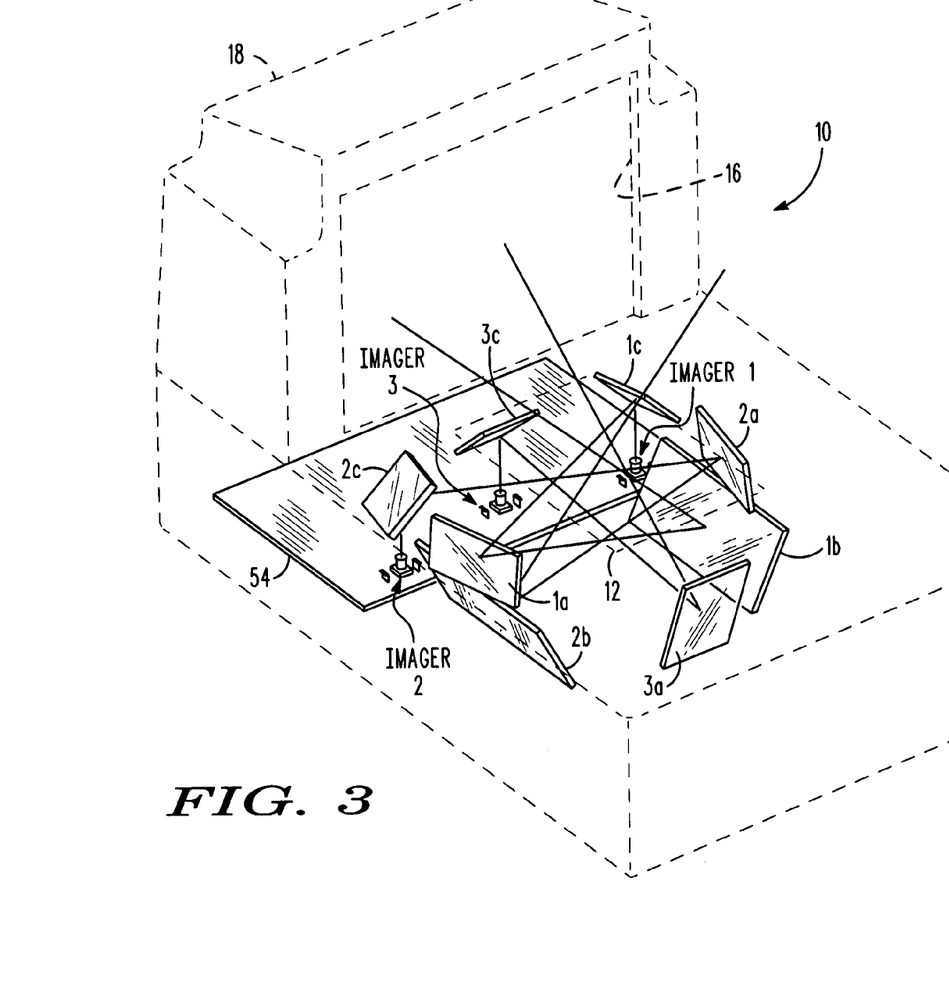
FIG. 3 is a perspective view of a dual window, bi-optical, point-of-transaction workstation or reader operative for reading indicia using a trio of imagers.
Figure 4:
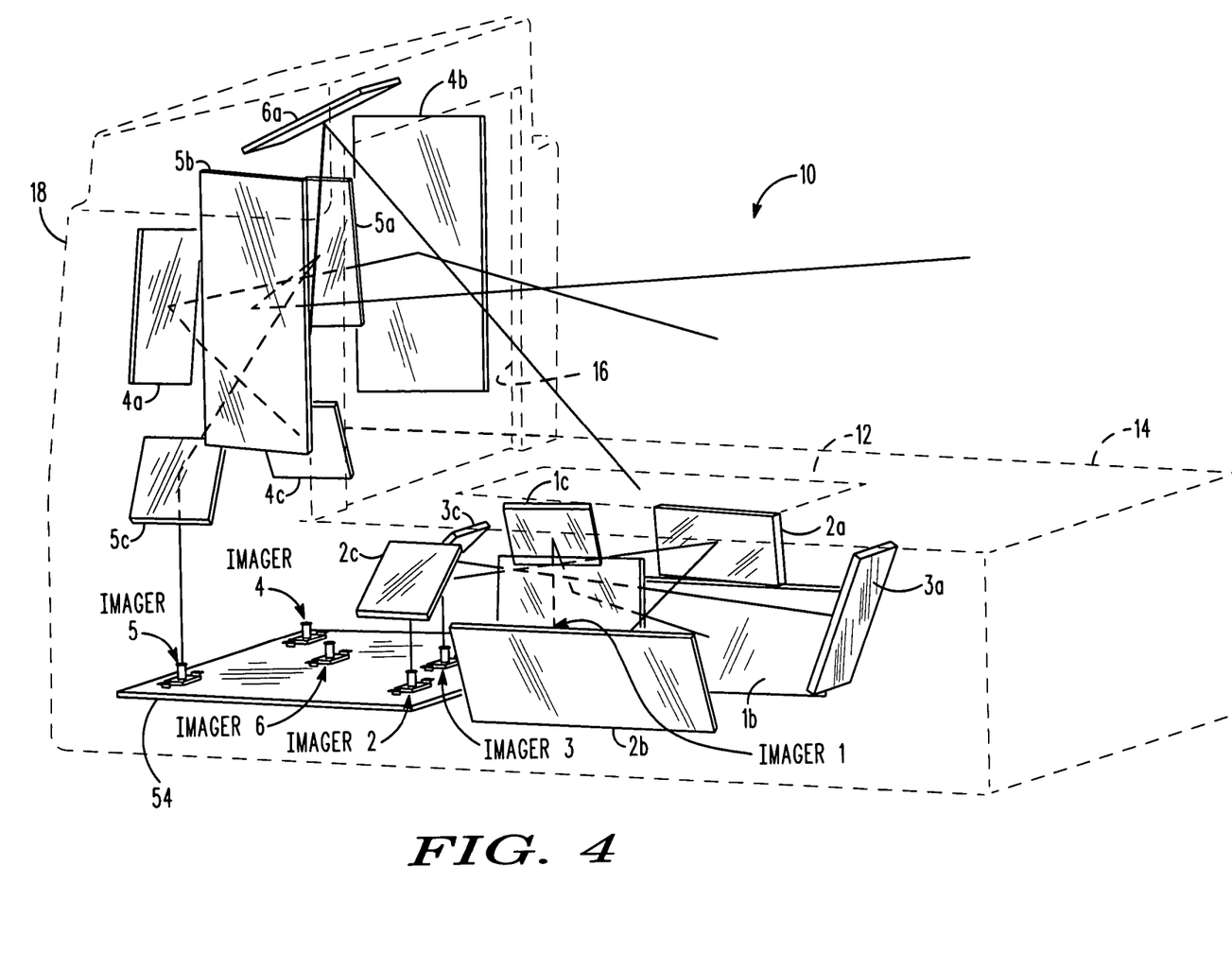
FIG. 4 is a view similar to FIG. 3 of another embodiment using six imagers.

As shown in FIG. 3, the motherboard 54 lies in a generally horizontal plane generally parallel to, and below, the generally horizontal window 12, and imager 1 faces generally vertically upward toward an inclined folding mirror 1c directly overhead at a right side of the window 12. The folding mirror 1c faces another inclined narrow folding mirror 1a located at a left side of the window 12. The folding mirror 1a faces still another inclined wide folding mirror 1b adjacent the mirror 1c. The folding mirror 1b faces out through the generally horizontal window 12 toward the left side of the workstation.

Imager 2 and its associated optics is mirror symmetrical to imager 1 and its associated optics. Imager 2 faces generally vertically upward toward an inclined folding mirror 2c directly overhead at the left side of the window 12. The folding mirror 2c faces another inclined narrow folding mirror 2a located at the right side of the window 12. The folding mirror 2a faces still another inclined wide folding mirror 2b adjacent the mirror 2c. The folding mirror 2b faces out through the generally horizontal window 12 toward the right side of the workstation.

Imager 3 and its associated optics are located generally centrally between imagers 1 and 2 and their associated optics. Imager 3 faces generally vertically upward toward an inclined folding mirror 3c directly overhead generally centrally of the window 12 at one end thereof. The folding mirror 3c faces another inclined folding mirror 3a located at the opposite end of the window 12. The folding mirror 3a faces out through the window 12 in an upward direction toward the raised housing portion 18.

As described so far, a trio of imagers 1, 2 and 3 capture light along different, intersecting fields of view along different directions through the generally horizontal window 12. Turning now to FIG. 4, an additional trio of imagers 4, 5 and 6 capture light along different, intersecting fields of view along different directions through the generally vertical window 16.

More particularly, imager 4 faces generally vertically upward toward an inclined folding mirror 4c directly overhead at a right side of the window 16. The folding mirror 4c faces another inclined narrow folding mirror 4a located at a left side of the window 16. The folding mirror 4a faces still another inclined wide folding mirror 4b adjacent the mirror 4c. The folding mirror 4b faces out through the generally vertical window 16 toward the left side of the workstation.

Imager 5 and its associated optics is mirror symmetrical to imager 4 and its associated optics. Imager 5 faces generally vertically upward toward an inclined folding mirror 5c directly overhead at the left side of the window 16. The folding mirror 5c faces another inclined narrow folding mirror 5a located at the right side of the window 16. The folding mirror 5a faces still another inclined wide folding mirror 5b adjacent the mirror 5c. The folding mirror 5b faces out through the generally vertical window 16 toward the right side of the workstation.

Imager 6 and its associated optics are located generally centrally between imagers 4 and 5 and their associated optics. Imager 6 faces generally vertically upward toward an inclined folding mirror 6a directly overhead generally centrally of the window 16 at an upper end thereof. The folding mirror 6a faces out through the window 16 in a downward direction toward the countertop.

In a conventional laser-based bi-optical workstation, the generally horizontal window measures about four inches in width by about six inches in length, and the generally vertical window measures about six inches in width by about ten inches in length. These large windows are filled with scan lines that project out several inches from the window, enabling indicia to be scanned anywhere within a large volume. The all imager-based bi-optical workstation described herein preferably uses similar window sizes and must also be able to scan anywhere across the windows and over a comparable working range as a laser-based workstation. The field of view of an imager capturing illumination light from the imager through a respective window does not inherently have these dimensions at the respective window and, hence, the field of view must be modified so that it matches the dimensions of the respective window at the respective window, thereby enabling indicia to be reliably read when located anywhere at the respective window, as well as within a range of working distances therefrom.

To achieve these goals, the optical path length from each imager to a respective window is maximized to enable filling the windows with their combined fields of view, while still allowing a narrow divergence angle of each field of view. This narrow divergence angle extends the range over which adequate pixel resolution is maintained. The folding mirrors 1a,1b,1c; 2a,2b,2c; 3a,3c; 4a,4b,4c; 5a,5b,5c; and 6a are used to fit the long optical path within the limited depth and other housing dimensions that are typical of bi-optical workstations. An adequately small divergence angle can be achieved with an optical path length of around eighteen to twenty inches. Shorter optical path lengths can be used, but the working range of adequate resolution will be reduced since a wider divergence angle will be needed to create an adequately sized field of view. Alternatively, a narrower divergence angle can be used with a shorter optical path, but the size of the field of view at the respective window will be reduced, which makes the reader more difficult to use. This may be satisfactory for less demanding scanning applications.

An aspect ratio of the field of view of an imager is normally the same as the aspect ratio of the pixel array. For example, if the array is 752×480 pixels, then the aspect ratio of the field of view is 752/480, or 1.56:1. Non-rotationally symmetrical optical elements, such as wider folding mirrors 1b, 2b, 4b and 5b, are used in the optical paths of some of the imagers, e.g., imagers 1, 2, 4 and 5, so as to modify the aspect ratio of their fields of view. The wider or longer folding mirrors 1b, 2b, 4b and 5b, as compared to their respectively associated narrower or shorter folding mirrors 1a, 2a, 4a and 5a, expands the respective field of view. This allows the shape of the fields of view to better fill the windows without being partially blocked by the edges of the windows, and also increases resolution of indicia that is tilted with respect to all optical axis of a respective imager. Other than wider mirrors, the field of view can also be modified by a lens or a lens surface integral within a focusing lens assembly associated with the respective imager.

A primary example of a situation where the reader must be able to read the indicia even when tilted with respect to the optical axis of the imager is the case where the indicia is flat against the generally horizontal window or against the generally vertical window, or the indicia is on a surface that is generally perpendicular to either window. The modified field of view angle of the imagers increases resolution along the 480 pixel axis (in the preferred embodiment), as compared to what it would have been if the field of view was unmodified, and if the size of the field of view in the 742 pixel dimension was the same as is needed to fill the windows with the fields of view.

In the preferred embodiment, the representative imager 1 uses the non-rotationally symmetrical optics or longer mirror 1b to increase the width of the wide dimension of the field of view (the dimension that is 752 pixels wide) by around 50%, as compared to what it would be with conventional rotationally symmetrical optics. The same is true for imager 2, imager 4 and imager 5. Imagers 3 and 6 do not use modified fields of view in the preferred embodiment shown, but they could be modified as necessary in different designs.

The same results could be achieved by shrinking the 480 pixel axis of the field of view (as opposed to increasing the 752 pixel axis), or shrinking one axis a little and increasing the other axis a little, as necessary, to achieve the desired aspect ratio of the field of view dimensions. Any method used to modify the aspect ratio of the field of view of at least one of the imagers is contemplated.

The combination of long optical paths and modified fields of view of some of the imagers is what makes the preferred embodiment able to achieve adequate resolution over the necessary working range while simultaneously essentially filling the windows with fields of view so that indicia can be scanned anywhere across either window, and also enabling high resolution imaging of indicia that are tilted with respect to the optical axes of the imagers. In other reader designs, these two features may be used independently, depending on the needs of the particular reader design. For example, a reader that does not need as much range may use an imager with a modified field of view, but not an extended path length, or vice versa. Notice, however, that in the preferred embodiment, if either the optical path length was reduced, or the aspect ratios of the fields of view were unmodified, additional imagers would have been needed to achieve the same scanning performance.

In the preferred embodiment, as noted above, each imager has all associated set of LEDs 32 that illuminate the indicia. The LED illumination systems include lenses (not shown) that concentrate the LED illumination light of each illuminator into a solid angle that approximately matches the field of view of each imager. The illumination for each imager is reflected off of the same folding mirrors as the field of view of its associated imager.

In many locations, the indicia can be seen by more than one imager for example, an indicium located flat against the horizontal window 12 can be seen by both imager 1 and imager 2. These two imagers look at the indicium from different angles, and their associated illuminators 32 illuminate the indicium from different angles. As a result, a glossy indicium which may be obscured by specular reflection from the point of view of one of the imagers 1 or 2 will not be obscured as seen from the position of the other imager 2 or 1, so that the indicium will still be readable. Of course, the reader's capability to read any indicium is increased by its ability to see the indicium with more than one imager, even in situations where specular reflection is not an issue.

In operation, in the preferred embodiment, the imagers will not be capturing images all at the same time. For example, imager 1 might capture an image first, followed by imager 2, imager 3, etc. Each imager will need an exposure time that is less than about 0.5 milliseconds, and each imager can capture a new image every 16.6 ms or so. Hence, if each imager captures an image approximately every 2.7 ms, all the imagers will capture an image about every 16.6 ms with no two imagers operating at the same time. The illumination LEDs 32 associated with each imager will only be energized during that imager's exposure time. This eliminates the possibility of uneven illumination that could occur if more than one set of illumination LEDs was energized at the same time. It also minimizes the peak current consumption of the entire reader, by eliminating the need to energize more than one set of illumination LEDs at the same time. Of course, it would also be possible to energize more than one imager at a time, as long as the light from any one imager did not interfere with the other imagers.

In the preferred embodiment, imagers 1, 2, 4 and 5 and their associated optics are all identical. They are focused at the same distance and use the same non-rotationally symmetrical optics to modify the aspect ratio of their respective field of view. Imagers 3 and 6 are identical to each other also. Hence, only two different imager designs are needed, thereby minimizing manufacturing cost.

Each illumination LED 32 will preferably be operating at a low duty cycle (less than around 3%) so that their illumination light will not look as bright to the human eye as they would look if they were energized continuously. Even so, since these are preferably very high powered LEDs, they can look dazzlingly bright if viewed directly. Light baffles (not shown) will therefore be installed to prevent direct viewing of the LEDs through either window by the operator. The only way to directly view the LEDs will be to position the eye in or very close to the field of view of one of the imagers. These fields of view and their associated illuminators do not project into the operator's eyes, or into the eyes of consumers who may be standing nearby during the reading process. Notice that the field of view and the associated illumination of imager 3 is projected towards the generally vertical window 16 of the reader, which blocks it from shining on a consumer who might be behind the end of the reader. Imager 6 and its associated illumination is aimed downwards toward the countertop to avoid shining in the operator's eyes.

There is some parallax between each set of illumination LEDs 32 and its associated imager. The direction of the illumination light rays from the LEDs 32 which the mounted on opposite sides of each imager is tilted to converge at a distance from the imager, so that the two illumination beams coincide as much as possible with the field of view of the imager over as much of the working range as possible. Each LED light beam needs to be tilted by only around one degree towards the imager to achieve this. Tilt of the LED light beam can be accomplished by shifting the LED focusing lens slightly closer to the imager than the LEDs are.

As described so far, the imagers 1, 2, 3, 4, 5 and 6, the illumination LEDs 32 and the controller 44 are commonly assembled on the motherboard 54. The joint installation and removal of the motherboard and all the components mounted thereon can be an expensive maintenance and manufacturing proposition. If only one imager malfunctions in the field, then the entire assembly may have to be replaced. During manufacture, each imager typically includes a focusing lens that has to be optically adjusted to focus a target on the respective imager. It can be difficult to adjust multiple imagers, all on the same motherboard. If dust occurs on only one of the focusing lenses and/or on only one of the imagers, typically as a byproduct of such adjustment, then the entire assembly may have to be removed to clean the dusty lens and/or imager, or replaced with a clean assembly.

Figure 5:
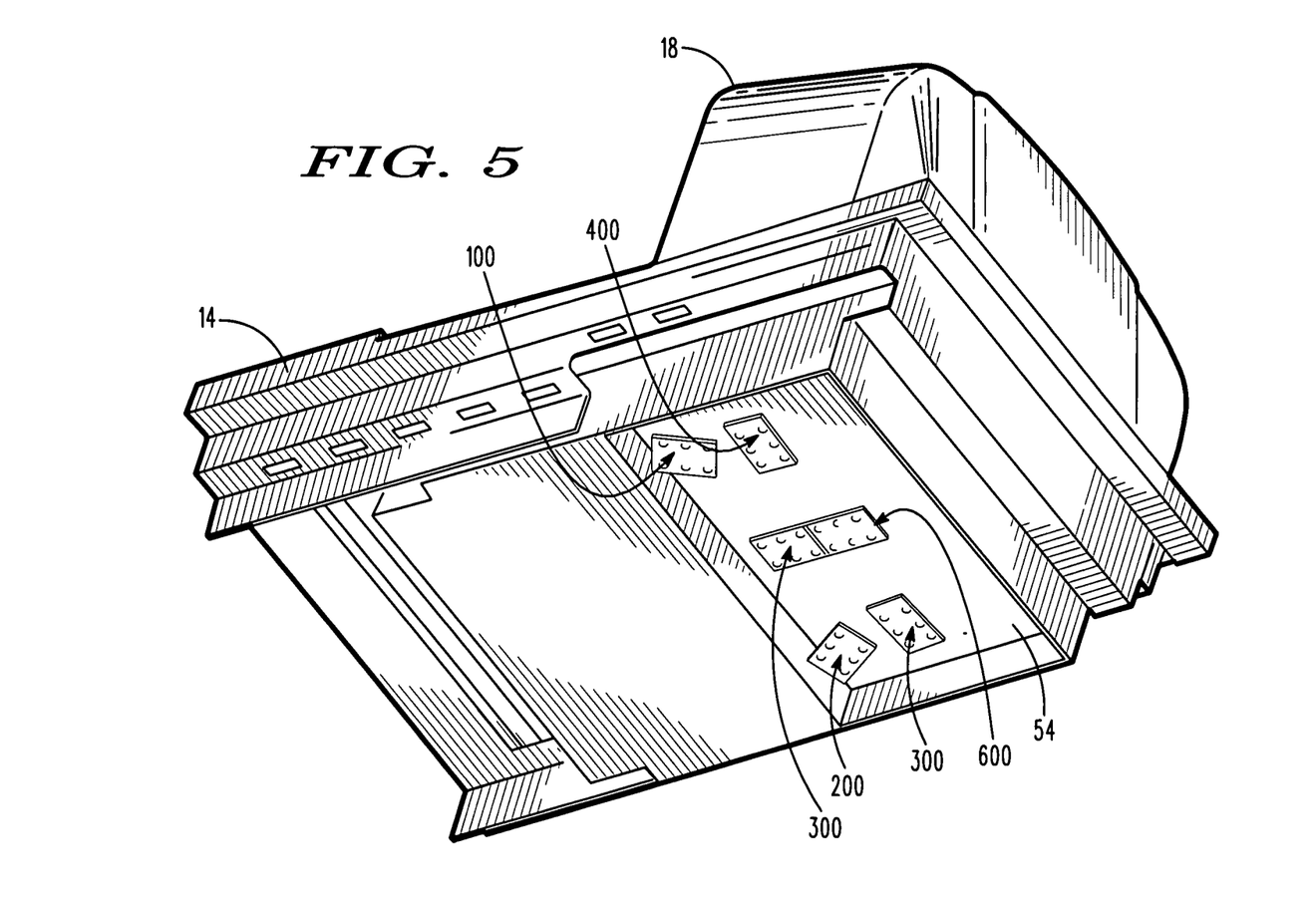
FIG. 5 is a bottom perspective view of a dual window, bi-optical, point-of-transaction workstation or reader analogous to the embodiment of FIG. 4, as seen from below with a lower protective cover removed, using six imaging modules, in accordance with this invention.
Figure 6:
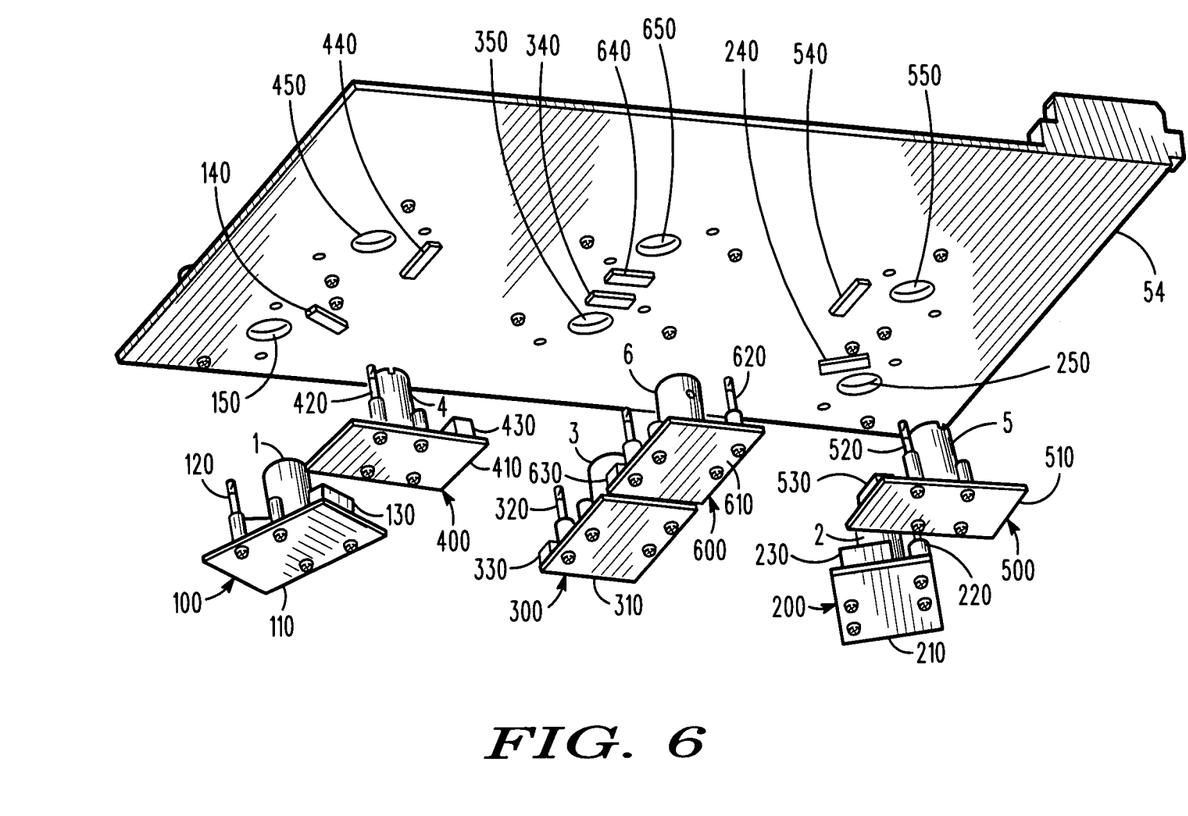
FIG. 6 is a bottom, exploded, perspective view depicting the assembly of the six imaging modules of FIG. 5 on a motherboard in accordance with this invention.

In accordance with one aspect of this invention, as depicted in FIGS. 5-6, a plurality of imaging modules 100, 200, 300, 400, 500 and 600 are individually mounted on the motherboard 54. Each imaging module 100, 200, 300, 400, 500 and 600 respectively includes the aforementioned solid-state imagers 1, 2, 3, 4, 5 and 6 mounted on respective individual printed circuit boards (PCBs) 110, 210, 310, 410, 510 and 610, for capturing light from the indicia along different fields of view. This individual installation of each module at, and individual removal of each module from, the motherboard 54 ensures, among other things, that the above-described entire motherboard assembly need not have to be replaced if only one of the imagers 1, 2, 3, 4, 5 and 6 malfunctions or fails. Preferably, each module 100, 200, 300, 400, 500 and 600 includes a plug-in module connector 130, 230, 330, 430, 530 and 630 mounted on the individual PCBs 110, 210, 310, 410, 510 and 610. Each module connector 130, 230, 330, 430, 530 and 630 connects to a respective plug-in board connector 140, 240, 340, 440, 540 and 640 mounted on the motherboard 54. Each module has a threaded fastener 120, 220, 320, 420, 520 and 620 for threadedly fastening the respective module to the motherboard 54. The focusing lens of each imager 1, 2, 3, 4, 5 and 6 is held in a cylindrical barrel which passes through alignment mounting holes 150, 250, 350, 450, 550 and 650 extending through the motherboard 54. An indicator lamp can be placed on each module to visually indicate which module on the motherboard 54 needs replacing, after removal of a protective cover from the housing. The cover has been removed from FIG. 5 to show the interior of the workstation from below.

In addition, as discussed above, it is easier to adjust the focusing lens of individual imagers, each on its own PCB, during manufacture, rather than adjust multiple imagers all mounted on the same motherboard. Also, as discussed above, it is easier to clean dust off of individual focusing lenses and/or individual imagers, each on its own PCB, then off of multiple focusing lenses and/or multiple imagers, all mounted on the same motherboard.

As described so far, six imaging modules 100, 200, 300, 400, 500 and 600 are preferably used in the bi-optical workstation to capture images from six sides of a target. Six-sided reading is most commonly used in supermarkets. Department stores and mass merchandisers, however, often do not need a six-sided image capture capability. A less expensive imaging bi-optical reader can be created for department stores and mass merchandisers by eliminating one of more imagers. This is easily accomplished by removing one or more of the modules 100, 200, 300, 400, 500 and 600 from the motherboard 54.

In addition, the modular nature of the modules enables individual modules to have different resolutions. For example, one or more modules at one or more locations on the motherboard 54 may have imagers configured with a megapixel (MP) resolution, while others of the modules may have imagers configured with a VGA or wide VGA (WVGA) resolution. A reader can thus be configured with a high performance (all MP resolution), or a lower performance (all VGA resolution), or be configured with mixed different resolutions at different locations. Such upgrades or downgrades can be performed at manufacture or in the field.

Advantageously, each illuminator LED 32 and the controller 44 are commonly mounted on the motherboard 54. The LED 32 is a heat source, which potentially could cause the performance of an adjacent imager to deteriorate as the temperature of the LED rises. As the imager gets hotter, more noise can be present in the captured image. By putting the respective imager on its own individual PCBs 110, 210, 310, 410, 510 and 610, the imager is spaced away from its associated LED, thereby enhancing imager performance. In some applications, it may be desirable to mount each illuminator LED 32 on the individual PCBs 110, 210, 310, 410, 510 and 610. In other applications, it may be desirable to comprise each illuminator LED 32 on an individual PCB as an illumination module for individual installation at, and individual removal from, the motherboard 54.

Any servicing or maintenance will therefore simply require removal of a gasketed access panel or cover from the bottom of the reader, thereby enabling access to the modules. Preferably, the motherboard 54 on which the modules are mounted is located no more than 100 millimeters below the generally horizontal plane.

It will be understood that each of the elements described above, or two or more together, also may find a useful application in other types of constructions differing from the types described above.

While the invention has been illustrated and described as embodied in a point-of transaction workstation for electro-optically reading indicia by using plug-in plural imaging modules, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. A reader for electro-optically reading indicia, comprising:
    a housing;
    multiple individual printed circuit boards (PCBs);
    a plurality of imaging modules, each module including a solid-state imager having a photodetector array therein, the solid-state imager being mounted on one of the multiple individual printed circuit boards (PCBs) with an optical axis of the solid-state imager substantially perpendicular to the individual printed circuit board, for capturing images of the indicia along different fields of view; and
    a motherboard on which the imaging modules are individually mounted for individual installation at, and individual removal from, the housing, wherein each one of the multiple individual printed circuit boards has the surface thereof parallel to the surface of the motherboard.

2. The reader of claim 1, wherein the housing has one window located in a generally horizontal plane, and another window located in a generally upright plane that intersects the generally horizontal plane, and wherein the imagers capture the light from the indicia through at least one of the windows.

3. The reader of claim 1, wherein each module includes an illuminator for illuminating the indicia during an exposure time period, and wherein each imager captures the light from a respective illuminator during a respective exposure time period, and wherein each illuminator is mounted on the motherboard.

4. The reader of claim 1, and a controller for controlling each imager to produce electrical signals indicative of the indicia being read, and for processing the electrical signals to read the indicia, and wherein the controller is mounted on the motherboard.

5. The reader of claim 1, wherein the housing has one window located in a generally horizontal plane, and another window located in a generally upright plane that intersects the generally horizontal plane, and wherein a first sub-plurality of the imagers captures the light from the indicia through one of the windows, and wherein a second sub-plurality of the imagers captures the light from the indicia through another of the windows, and wherein each sub-plurality of the imagers captures the light from the indicia over the different fields of view that intersect one another.

6. The reader of claim 1, wherein the housing has a window located in a generally horizontal plane, and wherein the motherboard on which the modules are mounted is no more than 100 millimeters below the generally horizontal plane.

7. The reader of claim 1, wherein each module includes a plug-in module connector mounted on the individual PCB, and a plurality of plug-in board connectors mounted on the motherboard for connection with each module connector.

8. The reader of claim 1, wherein the modules are interchangeably mounted on the motherboard.

9. The reader of claim 1, wherein each module has a fastener for fastening the respective module to the motherboard.

10. An assembly for use in electro-optically reading indicia, comprising:
    multiple individual printed circuit boards (PCBs);
    a plurality of imaging modules, each module including a solid-state imager having a photodetector array therein, the solid-state imager being mounted on one of the multiple individual printed circuit boards (PCBs) with an optical axis of the solid-state imager substantially perpendicular to the individual printed circuit board, for capturing images of the indicia along different fields of view; and
    a motherboard on which the imaging modules are individually mounted for individual installation at, and individual removal from, a reader for electro-optically reading the indicia, wherein each one of the multiple individual printed circuit boards has the surface thereof parallel to the surface of the motherboard.

11. A method of electro-optically reading indicia, comprising the steps of:
    capturing images of the indicia along different fields of view of a plurality of solid-state imagers mounted on one of multiple individual printed circuit boards (PCBs) to comprise a plurality of imaging modules, wherein the solid-state imager on each individual printed circuit boards has a photodetector array therein and has an optical axis thereof configured to be substantially perpendicular to the individual printed circuit board; and
    individually mounting the imaging modules on a motherboard for individual installation at, and individual removal from, a reader for electro-optically reading the indicia, wherein each one of the multiple individual printed circuit boards has the surface thereof parallel to the surface of the motherboard.

12. The method of claim 11, and configuring the reader with one window located in a generally horizontal plane, and another window located in a generally upright plane that intersects the generally horizontal plane, and wherein the capturing step is performed by capturing the light from the indicia through at least one of the windows.

13. The method of claim 11, and illuminating the indicia with illumination light from an illuminator during an exposure time period, and wherein the capturing step is performed by capturing the light from a respective illuminator during a respective exposure time period, and mounting each illuminator on the motherboard.

14. The method of claim 11, and controlling each imager with a controller to produce electrical signals indicative of the indicia being read, and processing the electrical signals to read the indicia, and mounting the controller on the motherboard.

15. The method of claim 11, and configuring the reader with one window located in a generally horizontal plane, and another window located in a generally upright plane that intersects the generally horizontal plane, and wherein the capturing step is performed by capturing the light by a first sub-plurality of the imagers through one of the windows, and wherein the capturing step is performed by capturing the light by a second sub-plurality of the imagers through another of the windows, and wherein each sub-plurality of the imagers captures the light from the indicia over the different fields of view that intersect one another.

16. The method of claim 11, and configuring the reader with a window located in a generally horizontal plane, and locating the motherboard on which the modules are mounted to be no more than 100 millimeters below the generally horizontal plane.

17. The method of claim 11, and mounting a plug-in module connector on each individual PCB, and mounting a plurality of plug-in board connectors on the motherboard for connection with each module connector.

18. The method of claim 11, and interchangeably mounting the modules on the motherboard.

19. The method of claim 11, and fastening each module to the motherboard.

20. The method of claim 11, and configuring the imagers of the modules with selectable resolutions.

* * * * *